United States Patent
Hecke et al.

(10) Patent No.: US 11,345,852 B2
(45) Date of Patent: May 31, 2022

(54) ETCHANT COMPOSITION

(71) Applicant: LAM RESEARCH AG, Villach (AT)

(72) Inventors: Angela Hecke, Villach (AT); Hongzhi Wang, Villach (AT); David Lou, Villach (AT)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 17/261,219

(22) PCT Filed: Aug. 15, 2019

(86) PCT No.: PCT/EP2019/071927
§ 371 (c)(1),
(2) Date: Jan. 19, 2021

(87) PCT Pub. No.: WO2020/035563
PCT Pub. Date: Feb. 20, 2020

(65) Prior Publication Data
US 2021/0277308 A1  Sep. 9, 2021

(30) Foreign Application Priority Data

Aug. 16, 2018 (GB) ..................... 1813368

(51) Int. Cl.
*C09K 13/00* (2006.01)
*H01L 21/311* (2006.01)
*C23F 1/00* (2006.01)
*H01L 21/306* (2006.01)
*C23F 1/18* (2006.01)
*C23F 1/28* (2006.01)
*H01L 21/3213* (2006.01)

(52) U.S. Cl.
CPC ............... *C09K 13/00* (2013.01); *C23F 1/00* (2013.01); *C23F 1/18* (2013.01); *C23F 1/28* (2013.01); *H01L 21/30604* (2013.01); *H01L 21/31111* (2013.01); *H01L 21/32134* (2013.01)

(58) Field of Classification Search
None
See application file for complete search history.

(56) References Cited

U.S. PATENT DOCUMENTS

| | | |
|---|---|---|
| 4,903,717 A | 2/1990 | Sumnitsch |
| 2010/0190347 A1 | 7/2010 | RamachandraRao et al. |
| 2014/0349479 A1 | 11/2014 | Mieth et al. |
| 2015/0104952 A1 | 4/2015 | Cui |
| 2017/0183607 A1 | 6/2017 | Shimada |
| 2017/0207087 A1 | 7/2017 | Roy et al. |
| 2018/0130706 A1 | 5/2018 | Chen et al. |
| 2018/0148669 A1 | 5/2018 | Payne et al. |

FOREIGN PATENT DOCUMENTS

| | | | |
|---|---|---|---|
| CN | 107287594 | * 10/2017 | ............ C23F 1/18 |
| WO | WO-2006027332 A1 | 3/2006 | |
| WO | WO-2018226594 A1 | 12/2018 | |

OTHER PUBLICATIONS

International Search Report and Written Opinion of the ISA issued in PCT/EP2019/071927, dated Dec. 5, 2019; ISA/EP.
GB Search Report of the Intellectual Property Office issued in Application No. GB1813368.6, dated Feb. 5, 2019.

* cited by examiner

*Primary Examiner* — Jiong-Ping Lu

(57) ABSTRACT

The present invention relates to an etchant composition, in particular to an aqueous masking layer etchant composition for use in the removal of tungsten-doped carbon masking layers from a surface of a substrate, such as a semiconductor wafer. The composition comprises (a) 10 to 40 wt. %, based on the total weight of the composition, of hydrogen peroxide; and (b) 0.1 to 2.0 wt. %, based on the total weight of the composition, of one or more corrosion inhibitors.

13 Claims, No Drawings ns filed on Aug. 15, 2019, which claims the benefit of Great Britain Patent Application No. GB 1813368.6, filed on Aug. 16, 2018. The entire disclosures of the applications referenced above are incorporated herein by reference.

ETCHANT COMPOSITION

CROSS-REFERENCE TO RELATED APPLICATIONS

This application is a U.S. National Phase Application under 35 U.S.C. 371 of International Application No. PCT/EP2019/071927, filed on Aug. 15, 2019, which claims the benefit of Great Britain Patent Application No. GB 1813368.6, filed on Aug. 16, 2018. The entire disclosures of the applications referenced above are incorporated herein by reference.

FIELD OF THE INVENTION

The present invention relates to an etchant composition and particularly, although not exclusively, to an aqueous masking layer etchant composition for use in the removal of a tungsten-doped carbon masking layer from a surface of a substrate, such as a semiconductor wafer.

BACKGROUND

Dry etching of semiconductor wafers typically use a hardmask masking layer to protect certain areas of the semiconductor wafer during etching. The hardmask must then be removed for the semiconductor to be processed further into the end product.

Hydrogen peroxide may be used to remove such hardmask masking layers. However, hydrogen peroxide is corrosive and may corrode copper present, such as copper contacts used in semiconductor wafers. The addition of less than 0.01 wt. % of copper corrosion inhibitors, such as benzotriazole or tolyl-triazole, to hydrogen peroxide is known.

The present invention has been devised in light of the above considerations.

SUMMARY

The present inventors have found that aqueous etchant compositions including hydrogen peroxide and less than 0.01 wt. % of a copper corrosion inhibitor show some reduction in the etch rate of copper when compared to hydrogen peroxide alone. However, the etch rate of other metals, specifically cobalt, is greatly increased.

At its most general, the present invention provides an aqueous etchant composition including hydrogen peroxide and at least 0.1 wt. %, based on the total weight of the composition, of one or more corrosion inhibitors, and the use such a composition to etch a masking layer on a substrate surface.

According to a first aspect, the present invention provides an aqueous etchant composition, the composition comprising:
  a. 10 to 40 wt. %, based on the total weight of the composition, of hydrogen peroxide; and
  b. 0.1 to 2.0 wt. %, based on the total weight of the composition, of one or more corrosion inhibitors.

The present inventors have found that such a composition provides good etch rates against masking layers (especially tungsten-doped carbon masking layers), while displaying low etch rates for copper and cobalt. As such, the composition shows good etch selectivity for masking layers over semiconductor wafer components, such as copper and cobalt.

According to a second aspect, the present invention provides a wet-etching method of removing a masking layer from a surface of a substrate, the method comprising the step of:
  a. Applying an aqueous etchant composition according to the first aspect to a surface of the masking layer on the substrate to etch at least part of the masking layer.

The invention includes the combination of the aspects and preferred features described except where such a combination is clearly impermissible or expressly avoided.

DETAILED DESCRIPTION OF THE INVENTION

Aspects and embodiments of the present invention will now be discussed. Further aspects and embodiments will be apparent to those skilled in the art. Any weight percentage (wt. %) of any component described herein is based on the total weight of the composition, unless specified otherwise.

Aqueous Composition

The etchant composition is an aqueous composition. The amount of water in the composition may be a balance amount to reach 100% after the other components are included in the composition. In some embodiments, water may be added to the composition. Any water added to the composition may be deionised or purified water.

In some embodiments, the etchant composition is a masking layer etchant composition to etch a masking layer on a substrate. In particular embodiments, the etchant composition is a hardmask layer etchant composition to etch a hardmask layer on a substrate. In more particular embodiments, the etchant composition is a tungsten-doped carbon masking layer etchant composition to etch a tungsten-doped carbon masking layer on a substrate.

Hydrogen Peroxide

The aqueous masking layer etchant composition includes 10 to 40 wt. % of hydrogen peroxide. In some embodiments, the aqueous masking layer etchant composition comprises 10 to 35 wt. % of hydrogen peroxide. In particular embodiments, the aqueous masking layer etchant composition comprises 25 to 32 wt. % of hydrogen peroxide.

In a particular embodiments, the aqueous masking layer etchant composition comprises 30 to 32 wt. % of hydrogen peroxide. In a particular embodiment, the aqueous masking layer etchant composition comprises about 31 wt. % of hydrogen peroxide.

Corrosion Inhibitor

The composition may comprise 0.1 to 2.0 wt. %, based on the total weight of the composition, of one or more corrosion inhibitors. In some embodiments, one or more of the corrosion inhibitors is an optionally substituted azole.

Azoles are a class of five-membered heterocyclic compounds containing a nitrogen atom and at least one other non-carbon atom (e.g. nitrogen, sulphur, or oxygen) as part of the ring. Specific examples of compounds within the azole class include:
  azoles with only nitrogen heteroatoms in the five-membered ring: imidazole; pyrazole; 1,2,3-triazole; 1,2,4-triazole; tetrazole; and pentazole;
  azoles with nitrogen and oxygen heteroatoms in the five-membered ring: oxazole; isoxazole; oxadiazole; furazan; and 1,3,4-oxadiazole;
  azoles with nitrogen and sulphur heteroatoms in the five-membered ring: thiazole; 1,2,3-thiadiazole; 1,2,4-thiadiazole; 1,2,5-thiadiazole; and 1,3,4-thiadiazole.

One or more of the corrosion inhibitors may be an unsubstituted azole selected from the group consisting of imidazole; pyrazole; 1,2,3-triazole; 1,2,4-triazole; tetrazole; pentazole; oxazole; isoxazole; oxadiazole; furazan; 1,3,4-oxadiazole; thiazole; isothiazole; 1,2,3-thiadiazole; 1,2,4-thiadiazole; 1,2,5-thiadiazole; and 1,3,4-thiadiazole.

Additionally or alternatively, one or more of the corrosion inhibitors may be a substituted azole. Any substituent in substituted azole typically replaces a hydrogen atom in one or more —NH and/or —CH groups of the azole group. In particular embodiments, the substituted azole group is an optionally substituted fused bicyclic heterocycle including the azole group. Particular examples of an optionally substituted fused bicyclic heterocycle including the azole group include, but are not limited to, an optionally substituted benzotriazole, an optionally substituted benzothiazole, and an optionally substituted benzimidazole.

One or more corrosion inhibitors may be selected from the group consisting of: tolyltriazole (TTA); benzotriazole (BTA); hydroxyl-benzotriazole (HBTA); 2-mercapto-benzotriazole (MBT); methyl-benzotriazole (C1-BTA), particularly 1H-methyl-benzotriazole; butyl-benzotriazole (C4-BTA); hexyl-benzotriazole (C6-BTA); octyl-benzotriazole (C8-BTA); dodecyl-benzotriazole (C12-BTA); 5-chloro-benzotriazole (501-BTA); 4-carboxy-benzotriazole (4-CBT); 5-carboxy-benzotriazole (5-CBT); 1-(2,3-dicarboxypropyl)-benzotriazole (BT-250); bis-(1-benzotriazoyl-methylene)-(2,5-thiadiazoly)disulphide (BBTD); 3-aminotriazole (ATA); 3-aminomercapto-triazole (AMT); 3-amino 5-methylthio-triazole (AMTT); bromobenzyl-carboxy-triazole (BCT); 2-mercapto-benzothiazole (MBTh); imidazole (IMD); 4-methylimidazole (MI); 1-phenyl-4-methylimidazole (PMI); 1-(p-tolyl)-4-methylimidazole (TMI); 4-methyl-5-hydroxymethylimidazole (MHMI); 2-mercapto-1methylimidazole (MMI); 4-methyl-5-imidazolecarbaldehyde (MIC); ethyl-4-methyl-imidazolecarboxylate (EMIC); 4-methyl-1(4-methoxyphenyl)imidazole (MMPI); benzimidazole (BI); 2-mercapto-benzimidazole (MBI); 2-amino-5-ethylthio-1,3,4-thiadiazole (AETD); 2-amino-5-ethyl-1,3,4-thiadiazole (AETDA); 5-(phenyl)-4H-1,2,4-triazole (PTAT); 5-benzylidene-2,4-dioxotetrahydro-1,3-thiazole (BDT); 5-(4'-isopropylbenzylidene)-2,4-dioxotetrahydro-1,3,-thiazole (IPBDT); 5-(3'-thenylidene)-2,4-dioxotetrahydro-1,3-thiazole (TDT); 5-(3',4'-dimethoxybenzylidene)-2,4-dioxotetrahydro-1,3-thiazole (MBDT); tetrazole (T); 5-mercapto-1-methyl-tetrazole (5Mc-1Me-T); 5-mercapto (Na salt)-1-methyl-tetrazole (5NaMc-1Me-T); 5-mercapto-1-acetic acid (Na salt)-tetrazole (5Mc-1Ac-T); 5-mercapto-1-phenyl-tetrazole (5Mc-1Ph-T); 1-phenyl-tetrazole (1PH-T); 5-phenyl-tetrazole (5Ph-T); and 5-amino-tetrazole (5NH2-T).

In particular embodiments, the composition comprises benzotriazole, a C1 to C12 alkyl-benzotriazole (Cx-BTA), or a mixture thereof. In some embodiments, the composition comprises one of benzotriazole or a C1 to C12 alkyl-benzotriazole as the sole corrosion inhibitor.

Benzotriazole has a known structure and can be substituted in one or more of a number of positions by a C1 to C12 alkyl group.

The C1 to C12 alkyl-benzotriazole may exist as two or more structural isomers. Unless a specific isomer or mixture of isomers is specified, the C1 to C12 alkyl-benzotriazole may be any one of the isomers or any combination of isomers. The composition may include a single isomer or a mixture of isomers. For example, when the composition includes 1H-methyl benzotriazole, the composition may include a single isomer selected from 1H-4-methyl benzotriazole, 1H-5-methyl benzotriazole, 1H-6-methyl benzotriazole, 1H-7-methyl benzotriazole or a mixture of two, three or four of these isomers. In particular, the term tolyltriazole (TTA) is generally used for the commercial mixture composed of all four 1H-methyl benzotrazole isomers, namely 1H-4-methyl benzotriazole, 1H-5-methyl benzotriazole, 1H-6-methyl benzotriazole and 1H-7-methyl benzotriazole. TTA typically includes approximately equal amounts of 4- and 5-methylbenzotriazole with small quantities of the 6- and 7-methyl isomers.

In particular embodiments, the (C1 to C12 alkyl)$_y$-benzotriazole is a 1H—C1 to C12 alkyl-benzotriazole. In other words, a nitrogen atom in the benzotriazole ring is protonated.

The C1 to C12 alkyl group as defined herein may be straight chain or branched. In some embodiments, the C1 to C12 alkyl group is a straight chain alkyl group. The C1 to C12 alkyl group as defined herein may be saturated or unsaturated. In a particular embodiment, the C1 to C12 alkyl group is a saturated alkyl group.

In particular embodiments, the composition comprises tolytriazole (TTA), benzotriazole (BTA) or a mixture thereof.

In one particular embodiment, the composition comprises a mixture of tolyltriazole (TTA) and benzotriazole (BTA) as the corrosion inhibitor. In another particular embodiment, the composition includes tolyltriazole (TTA) as the sole corrosion inhibitor.

The composition includes 0.1 to 2.0 wt. % of one or more corrosion inhibitors. In other words, the minimum amount of corrosion inhibitor in the composition is 0.1 wt. % based on all of the corrosion inhibitors present and the maximum amount of corrosion inhibitor in the composition is 2.0 wt. % based on all of the corrosion inhibitors present. The composition may include a sole corrosion inhibitor or a mixture of corrosion inhibitors. When the composition includes a sole corrosion inhibitor, the composition comprises 0.1 wt. % to 2.0 wt. % of the sole corrosion inhibitor. In one embodiment, the composition comprises 0.1 wt. % to 2.0 wt. % of one of benzotriazole or a C1 to C12 alkyl-benzotriazole as the sole corrosion inhibitor, particularly 0.1 wt. % to 2.0 wt. % of tolyltriazole (TTA) as the sole corrosion inhibitor. When the composition comprises a mixture of two or more corrosion inhibitors, the composition comprises 0.1 wt. % to 2.0 wt. % of all corrosion inhibitors.

In some embodiments, the composition includes from 0.25 to 0.75 wt. % of one or more corrosion inhibitors. In particular embodiment, the aqueous masking layer etchant composition includes from 0.4 to 0.6 wt. % of tolyltriazole (TTA).

In some embodiments, the composition is acidic. In other words, the composition may have a pH of 6.9 or lower. In some embodiments, the composition has a pH in the range of 1 to 6.9. In particular embodiments, the composition has a pH in the range of 4 to 6.9.

Further Etchant Additives

In some embodiments, the composition includes one or more layer etchant additives. In particular embodiments, the composition includes 0.0001 to 1 wt. % layer etchant additives. In more particular embodiments, the composition includes 0.0001 to 0.1 wt. % layer etchant additives.

In some embodiments, the composition is substantially free of additional etchant additives. In some embodiments, the composition consists essentially of:
 a. 10 to 40 wt. %, based on the total weight of the composition, of hydrogen peroxide; and
 b. 0.1 to 2.0 wt. %, based on the total weight of the composition, of one or more corrosion inhibitors with the balance being water.

In a particular embodiment, the composition consists essentially of:
a. 30 to 32 wt. % hydrogen peroxide;
b. 0.4 to 0.6 wt. % tolyltriazole (TTA); and
c. 0.001 to 0.002 wt. % benzotriazole (BTA)
with the balance being water.

In another embodiment, the composition consists essentially of:
a. 30 to 32 wt. % hydrogen peroxide; and
b. 0.4 to 0.6 wt. % tolyltriazole (TTA)
with the balance being water.

These compositions, consisting essentially of hydrogen peroxide and one or more corrosion inhibitors, avoid the use of an excessive number of components, whilst still achieving good etching performance of tungsten-doped carbon masking layers (as demonstrated in the examples below). This permits cost savings, and avoids the use of other potentially harmful chemicals.

Method of Using the Composition

The present invention also provides a wet-etching method of removing a masking layer from a surface of a substrate, the method comprising the step of:
a. Applying an aqueous etchant composition as described herein to a surface of the masking layer on the substrate to etch at least part of the masking layer.

In particular embodiments, the masking layer is a hardmask layer. In more particular embodiments, the masking layer is a tungsten-doped carbon masking layer. In these embodiments, the tungsten-doped carbon masking layer may contain tungsten at an atomic concentration in the range of 30 to 70 atom % and amorphous carbon.

In some embodiments, the aqueous etchant composition is applied to the masking layer at a temperature of 50° C. or higher. In some embodiments, the composition is applied to the masking layer at a temperature in the range of 50 to 100° C. In particular embodiments, the composition is applied to the masking layer at a temperature in the range of 60 to 80° C. To bring the aqueous etchant composition to a temperature within the ranges above, the method may include a step of heating the composition to a temperature of 50° C. or higher, in the range of 50 to 100° C., or in the range of 60 to 80° C.

In some embodiments, the method further includes step (b) of rinsing the substrate with a rinsing liquid after the step of applying the aqueous etchant composition (step (a)). The rinsing liquid may be any rinsing liquid suitable for rinsing etched substrates, such as semiconductor wafers. In one embodiment, the rinsing liquid is deionised water. The rinsing liquid may be an aqueous rinsing liquid including one or more rinsing liquid additives.

In particular embodiments, the method further includes one or more steps of drying the substrate. A first drying step may follow step (a) to remove excess aqueous etchant composition from the substrate. A second or alternative drying step may follow step (b), when present, remove excess rinsing liquid from the substrate. The method of drying the substrate in any drying step is not particularly limited. In some embodiments, a drying step includes a flow of gas over a surface of the substrate to be dried. In these embodiments, the gas may be heated. In these embodiments, the drying step may include a flow of gas wherein the gas is at a temperature in the range of 20° C. to 100° C. The temperature of the gas may be in the range of 30° C. to 80° C., or 40° C. to 60° C.

The masking layer on the surface of the substrate may be exposed to aqueous etchant composition in the range of 10 seconds to 2 minutes. In some embodiments, the masking layer on the surface of the substrate may be exposed to aqueous etchant composition in the range of 20 seconds to 40 seconds.

In particular embodiments, the step of applying the aqueous etchant composition to the surface of the substrate by a liquid spin process (also referred to as spin etching or wet spin processing). Non-limiting examples of apparatus used in liquid spin processes are found in U.S. Pat. No. 4,903,717 and WO 2006/027332.

In such a liquid spin process, the substrate is typically held on a rotatable platform while the aqueous etchant composition is applied to the masking layer. The surface of the substrate with the masking layer (the surface to be treated) is typically planar and the substrate may be held horizontally with respect to this plane. The platform and substrate rotate about a rotational axis. The rotational axis is typically perpendicular to the plane of the surface of the masking layer to which the aqueous etchant composition is applied.

The rotational axis typically intersects the centre of the surface of the substrate to which the aqueous etchant composition is applied and the aqueous etchant composition is applied to the centre of the surface of the substrate. In this way, the aqueous etchant composition as described herein may move from the centre (or inner region) of the substrate surface to the outer region of the substrate surface by centrifugal force. Additionally or alternatively, the point of impact of the aqueous etchant composition on the masking layer on the surface of the substrate is moved across the surface of the substrate in a time sequence.

In some embodiments, the volume flow of aqueous etchant composition to the surface of the rotating substrate is at least 0.05 l/min. In particular embodiments, the volume flow of aqueous etchant composition to the surface of the rotating substrate is at least 0.5 l/min. In some embodiments, the aqueous etchant composition is applied to the masking layer on the surface of the substrate as a continuous flow of liquid.

In some embodiments, the rotational speed of the platform and substrate is 60 rpm or higher when the aqueous etchant composition is applied to the masking layer of the substrate. In particular embodiments, the rotational speed of the platform and substrate is 300 rpm or higher when the aqueous etchant composition is applied to the masking layer of the substrate.

In some embodiments, the aqueous etchant liquid is applied to the surface of the rotating substrate as a free beam of liquid. In other words, the liquid is applied to the surface of the substrate without any physical constraints. Such a free beam of liquid may be applied by dispensing the aqueous etchant composition from an aqueous etchant composition dispenser a distance from the surface and letting a force, such as gravity, bring the liquid to the surface. In some embodiments, the method includes dispensing the aqueous etchant composition from an aqueous etchant composition dispenser positioned above the masking layer on the surface of the substrate such that aqueous etchant composition is applied to the masking layer on the surface of the substrate.

In some embodiments, any material (such as aqueous etchant composition and/or masking layer) flowing from the surface of the substrate may be collected by an annular liquid collector surrounding the rotating platform and substrate.

The substrate may be held by the rotatable platform by any known substrate gripping means. In particular embodiments, the substrate is held by the rotatable platform by a vacuum chuck (or grip), edge gripping chuck or Bernoulli chuck (or grip).

In some embodiments, the substrate is a semiconductor wafer.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For the avoidance of any doubt, any theoretical explanations provided herein are provided for the purposes of improving the understanding of a reader. The inventors do not wish to be bound by any of these theoretical explanations.

Any section headings used herein are for organizational purposes only and are not to be construed as limiting the subject matter described.

Throughout this specification, including the claims which follow, unless the context requires otherwise, the word "comprise" and "include", and variations such as "comprises", "comprising", and "including" will be understood to imply the inclusion of a stated integer or step or group of integers or steps but not the exclusion of any other integer or step or group of integers or steps.

It must be noted that, as used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by the use of the antecedent "about," it will be understood that the particular value forms another embodiment. The term "about" in relation to a numerical value is optional and means for example +/−10%.

EXAMPLES

Example 1

The etch rate of various components of a silicon semiconductor wafer including copper, cobalt and a tungsten-doped carbon (WDC) masking layer (having 50 atomic % W) using the following three compositions (all values given in weight percent based on the total weight of the composition):

|  | A | B | C |
|---|---|---|---|
| Hydrogen Peroxide | 31% | 31% | 31% |
| Benzotriazole (BTA) | 0 | 0.0017% | 0.0017% |
| Tolyl-triazole (TTA) | 0 | 0 | 0.5% |
| Water | Balance | balance | balance |

Compositions A and B are comparative compositions. Composition C is a composition according to the present invention.

Silicon semiconductor wafers including copper, cobalt and a tungsten-doped carbon masking layer (having 50 atomic % W) were placed in separate beakers, each beaker containing one of compositions A to C heated to 70° C. for around 30 seconds before removing and rinsing the wafers. The etch rates of each of the WDC, copper, and cobalt were calculated by measuring the change in thickness of the layer and dividing the thickness by the time exposed to the aqueous etchant composition, and the etch rate (in angstroms per minute) of each component from exposure to each composition are shown in the following table.

| Etch rates (A/min) | A | B | C |
|---|---|---|---|
| WDC | 45.4 | 89.1 | 75.3 |
| Cu | 3.1 | 0.7 | 0.3 |
| Co | 2.0 | 71.9 | 0.0 |

As can be seen from the table above, the addition of a small (less than 0.01 wt. %) of BTA corrosion inhibitor in composition B decreases the etch rate of copper when compared to hydrogen peroxide alone in composition A. However, composition B shows a higher etch rate of cobalt compared to composition A. In contrast, composition C including 0.5 wt. % TTA (keeping the level of BTA the same) shows a decrease in the etch rate of both copper and cobalt when compared to compositions A and B. In addition, the etch rate of the WDC masking layer is increased using composition C when compared to composition A.

Treatment of silicon semiconductor wafers including copper, cobalt and a tungsten-doped carbon masking layer was repeated using compositions B and C using a liquid spin process at 70° C. and 65° C. respectively. The etch rates of each of the WDC, copper, cobalt and bare silicon were calculated by measuring the change in thickness of the layer and dividing the thickness by the time exposed to the aqueous etchant composition, and the etch rate (in angstroms per minute) of each component from exposure to each composition are shown in the following table.

| Etch rates (A/min) | B | C |
|---|---|---|
| WDC | 125.6 | 133.2 |
| Cu | 2.8 | 0.6 |
| Co | 71.9 | 0.0 |
| Bare Si | 358 | 36 |

As can be seen from the table above, composition C (a composition according to the present invention) provides markedly decreased etch rates for copper, cobalt and bare silicon when compared to composition B (a comparative composition). The etch rate of the tungsten-doped carbon masking layer is comparable in both compositions.

REFERENCES

A number of publications are cited above in order to more fully describe and disclose the invention and the state of the art to which the invention pertains. Full citations for these references are provided below.

U.S. Pat. No. 4,903,717
WO 2006/027332

The invention claimed is:

1. An aqueous etchant composition, the composition comprising:
   a. 30 to 32 wt. %, based on a total weight of the composition, of hydrogen peroxide; and
   b. 0.1 to 2.0 wt. %, based on the total weight of the composition, of one or more corrosion inhibitors including 0.4 to 0.6 wt %, based on the total weight of the composition, of tolyltriazole (TTA),
   wherein the composition is substantially free of additional etchant additives.

2. The aqueous etchant composition according to claim 1 wherein the composition has a pH of 6.9 or lower.

3. The aqueous etchant composition according to claim 2 having a pH of 4 to 6.9.

4. The aqueous etchant composition according to claim 1, wherein the composition comprises 0.4 to 0.6 wt % of tolyltriazole (TTA) as a sole corrosion inhibitor.

5. The aqueous etchant composition according to claim 1, wherein the composition comprises 0.25 to 0.75 wt. % of the one or more corrosion inhibitors.

6. The aqueous etchant composition according to claim 1, wherein the composition consists essentially of:
   a. 30 to 32 wt. % hydrogen peroxide;
   b. 0.4 to 0.6 wt. % tolyltriazole (TTA); and
   c. 0.001 to 0.002 wt. % benzotriazole (BTA).

7. The aqueous etchant composition according to claim 1, wherein the composition consists essentially of
   a. 30 to 32 wt. % hydrogen peroxide; and
   b. 0.4 to 0.6 wt. % tolyltriazole (TTA).

8. A wet-etching method of removing a masking layer from a surface of a substrate, the method comprising the step of:
   a. applying the aqueous etchant composition according to claim 1 to a surface of the masking layer on the substrate to etch at least part of the masking layer.

9. The method according to claim 8 wherein the masking layer is a tungsten-doped carbon masking layer.

10. The method according to claim 9 wherein the tungsten-doped carbon masking layer contains tungsten at an atomic concentration in a range of 30 to 70 atom % and amorphous carbon.

11. The method according to claim 8, wherein the aqueous etchant composition is applied to the masking layer at a temperature of 50° C. or higher.

12. The method according to claim 8, further comprising the steps of (i) rinsing the substrate with a rinsing liquid after the step of applying the aqueous etchant composition and then (ii) drying the substrate.

13. The method according to claim 8, wherein the substrate is a semiconductor wafer.

* * * * *